United States Patent [19]
Bae

[11] Patent Number: 5,882,980
[45] Date of Patent: Mar. 16, 1999

[54] PROCESS OF FORMING BIPOLAR ALIGNMENT MARK FOR SEMICONDUCTOR

[75] Inventor: Sang Man Bae, Kyoungki-do, Rep. of Korea

[73] Assignee: Hyundai Electronics Industries Co., Ltd., Rep. of Korea

[21] Appl. No.: 897,145

[22] Filed: Jul. 21, 1997

Related U.S. Application Data

[63] Continuation of Ser. No. 659,868, Jun. 7, 1996, abandoned, which is a continuation of Ser. No. 323,230, Oct. 14, 1994, abandoned.

[30] Foreign Application Priority Data

Oct. 15, 1993 [KR] Rep. of Korea .................. 9321406

[51] Int. Cl.$^6$ ................................................. H01L 21/76
[52] U.S. Cl. .................. 438/401; 148/DIG. 102
[58] Field of Search .................. 437/31, 924, 7, 437/225, 228, 984; 148/DIG. 102; 438/401

[56] References Cited

U.S. PATENT DOCUMENTS 5,128,283   7/1992   Tamaka ................................. 437/924

FOREIGN PATENT DOCUMENTS 0097327   5/1987   Japan ................................. 437/924

OTHER PUBLICATIONS

Application Ser. No. 08/273,904, Eui Kyu Ryou, filing date Jul. 12, 1994.

Application Ser. No. 08/321,448, Bae, filing date Oct. 12, 1994.

*Primary Examiner*—Tuan H. Nguyen
*Attorney, Agent, or Firm*—Gary M. Nath; Harold L. Novick; Nath & Associates

[57] ABSTRACT

There are disclosed a bipolar alignment mark structure for semiconductor device and a process for forming the same. The bipolar alignment mark structure comprises: a semiconductor substrate having a scribe region for defining a integrated circuit region; a plurality of negatively polar alignment marks having a form of trench which are aligned on the scribe region regularly distant from one another; and a plurality of positively polar alignment marks having a form of column which are aligned in such a way that they alternate with the negatively polar alignment marks. A step generated in the structure is more enlarged, which allows easy and accurate measurement of alignment mark. Based on this ease, the structure gives convenience to the fabrication process for a semiconductor device, along with high yield. In addition, the accuracy in measuring alignment mark can bring about an effect that the semiconductor device is improved in reliability.

4 Claims, 2 Drawing Sheets

PROCESS OF FORMING BIPOLAR ALIGNMENT MARK FOR SEMICONDUCTOR

This application is a continuation of U.S. patent application Ser. No. 08/659,868, filed Jun. 7, 1996 now abandoned; which is a continuation of U.S. patent application Ser. No. 08/323,230, filed on Oct. 14, 1994 now abandoned.

BACKGROUND OF THE INVENTION

1. Field of the Invention

The present invention relates, in general, to a bipolar alignment mark structure for a semiconductor device which is used to align pattern masks with a semiconductor substrate so as to overlap the pattern masks with patterns formed over the semiconductor substrate and, more particularly, to a bipolar alignment mark structure capable of indicating standard coordinates on the semiconductor substrate, accurately and distinctively. The present invention also is concerned with a process for forming the bipolar alignment mark structure.

2. Description of Prior Art

Generally, a fabrication process for semiconductor device comprises the use of a plurality of light-exposure masks with different pattern shapes in such a manner to put one to another, so as to form circuit devices, multilayer wires and contacts over the surface of semiconductor substrate. Such many light-exposure masks are located over the semiconductor substrate by stages according to process order.

In order to align the light-exposure masks stepwise, it is necessary to take for a standard a patterned mark which is formed on the semiconductor substrate. Usually, the patterned mark to be used to align the light-exposure masks is called "alignment key" or "alignment mark", hereinafter referred to as "alignment mark" for convenience.

There is a stepper, an alignment equipment which positions one light-exposure mask or aligns two or more light-exposure masks with one another over semiconductor substrate by use of the alignment mark. The stepper is a light-exposure equipment operating in step-and-repeat manner, which is movable on plane, e.g. in X-Y directions and has a stage capable of mounting a wafer thereon. In addition, the stepper is provided with a mark-detecting equipment which senses an alignment state of the light-exposure masks by detecting the alignment marks formed over the wafer. According to the output from the mark-detecting equipment, the stage moves the wafer forward and backward or leftward and rightward to align the water with the light-exposure mask in such a way that a pattern region formed over the wafer entirely overlaps with a pattern region formed on the light-mask fixed above the wafer. Meanwhile, the mark-detecting equipment irradiates the alignment marks on the wafer and light-exposure mask with a laser beam with a frequency and senses the reflected beam passing through a predetermined optical passage system to a light sensor, so as to detect the position of the alignment marks.

The alignment marks, which are used to align the wafer and the light-exposure masks as previously mentioned, are formed over scribe regions, parts of semiconductor substrate where no integrated circuit is formed. And, they are formed in such a way so as to generate steps at the scribe regions.

However, since conventional alignment marks of semiconductor substrate are formed in monopolar arrangement having merely either depression or prominence, material layers coated sequentially over them during the fabrication process for integrated circuit cannot help but have limitedly enlarged stepped portions. Owing to such limitation in the stepped portion, a problem is generated in that the conventional monopolar alignment mark cannot play a role as standard coordinates as the number of layer formed over the monopolar alignment mark is increased. This is because the stepped portion comes to disappear or be indistinguishable as material layers are piled over the monopolar alignment mark. Such removal or indistinctness of the stepped portion leads to incapability of accurately indicating standard coordinates on the semiconductor substrate. In addition, the monopolar alignment mark with no or indistinguishable step is incapacitated from playing a role of standard coordinate.

As a result, conventional monopolar alignment marks formed over the semiconductor substrate are likely to cause the misalignment of light-exposure mask with the semiconductor device, considerably lowering the production yield of semiconductor device.

In order to better understand the background of the invention, conventional monopolar alignment mark will be now described with reference to FIGS. 1 through 4. This description is on the premise that the monopolar alignment marks shown in FIGS. 1 through 4 are applied to fabrication processes for DRAM or SRAM device.

Referring to FIGS. 1 and 2, there are a plane view showing conventional positive polar alignment marks with a shape of prominence and depression and a cross sectional view taken generally through line II—II of FIG. 1, respectively.

On a scribe region of a semiconductor substrate 11, as shown in these figures, there is first entirely coated a first remaining layer 13. This first remaining layer 13 may be formed by, for example, a polysilicon-coating process for the formation of capacitor. A plurality of positively polar alignment marks 15 of rectangular column are aligned parallel to and regularly distant from one another, on the surface of the first remaining layer 13. The positively polar alignment marks 15 may be formed by forming a second remaining layer of inter-polyoxide film or of planarization film and patterning the second remaining layer by means of etch. Thereafter, a predetermined material, for example, a metal is uniformly coated on the positively polar alignment marks 15 and on the exposed area of the first remaining layer 13 to form a third remaining layer 17. There are generated steps A on the surface of the third remaining layer 17 each of which has a height corresponding to the altitude of the rectangular column, as shown in FIG. 2. A laser beam incident to the stepped portion formed on the surface of the third remaining layer 17 is diffusely reflected, so that the positively polar alignment marks can be detected by the mark-detecting equipment of stepper.

Referring now to FIGS. 3 and 4, there are shown a conventional semiconductor device having a plurality of negatively polar alignment marks and a cross sectional view taken generally through line IV—IV of FIG. 3, respectively.

First, as shown in these figure, on a scribe region of a semiconductor substrate 21, there is entirely coated a first remaining layer 23. This first remaining layer 13 may be formed by a predetermined process, for example, a polysilicon-coating process for the formation of capacitor. Following completion of the coating, on the first remaining layer 23, there is formed a second remaining layer pattern 25 where a plurality of negatively polar alignment marks 26 is present parallel to and regularly distant to one another. The negatively polar alignment marks 26 have a form of groove and expose the first remaining layer 23 partly therethrough. The second remaining layer pattern 2S may be formed by a predetermined process comprising, for example, coating an inter-polyoxide film on the first remaining layer 23 to form a second remaining layer and patterning the second remaining layer by means of etch. Thereafter, a predetermined material, for example, a metal is uniformly coated on the second remaining layer pattern 25 and the exposed areas of the first remaining layer 23 to form a third remaining layer 27. There are generated steps B on the surface of the third remaining layer 27, each of which has a height corresponding to the thickness of the second remaining layer pattern 25, as shown in FIG. 4. A laser beam incident to the stepped portion formed on the surface of the third remaining layer 27 is diffusely reflected, which capacitates the mark-detecting equipment of the stepper to detect the negatively polar alignment marks.

Such conventional monopolar alignment marks as have either positive or negative polarity cannot but help limitedly enlarging the step at the surface of the remaining layer laminated on themselves, as mentioned hereinbefore. Further, conventional monopolar alignment mark has such a problem attributed to the limited step that it is incapacitated from indicating standard coordinates on the semiconductor substrate as the number of the layers piled on the alignment mark is increased. Furthermore, it is more difficult for the conventional monopolar alignment mark to indicate standard coordinates on the semiconductor substrate when a metal layer is coated on the alignment mark. With the conventional monopolar alignment mark structure, as a result, the semiconductor substrate cannot be aligned with light-exposure masks accurately, and production yield in semiconductor device is considerably lowered. The above problems are more serious as the distance between wires is reduced with a highly integrated semiconductor device.

SUMMARY OF THE INVENTION

An object of the present invention, therefore, is to overcome the above problems encountered in prior arts and to provide a novel alignment mark structure for semiconductor device capable of indicating standard coordinates on a semiconductor substrate, accurately and distinctively.

Another object of the present invention is to provide a process for forming the alignment mark structure.

In accordance with an aspect of the present invention, there is provided a bipolar alignment mark structure of semiconductor device, comprising: a semiconductor substrate having a scribe region for defining a integrated circuit region; a plurality of negatively polar alignment marks having a form of trench which are aligned on the scribe region regularly distant from one another; and a plurality of positively polar alignment marks having a form of column which are aligned in such a way that they alternate with said negatively polar alignment marks.

In accordance with another aspect of the present invention, there is provided a process for forming a bipolar alignment mark structure in a semiconductor device, comprising the steps of: forming a first remaining layer on a scribe region of a semiconductor substrate; patterning the first remaining layer to form a plurality of negatively polar alignment marks in such a way that they are aligned regularly distant from one another; forming a second remaining layer entirely over the resulting exposed surfaces with a material different from the first remaining layer in etch selection ratio; and etching the second layer to form a plurality of positively polar alignment marks in such a way that they alternate with the negatively polar alignment marks.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENTS

Figure 1:
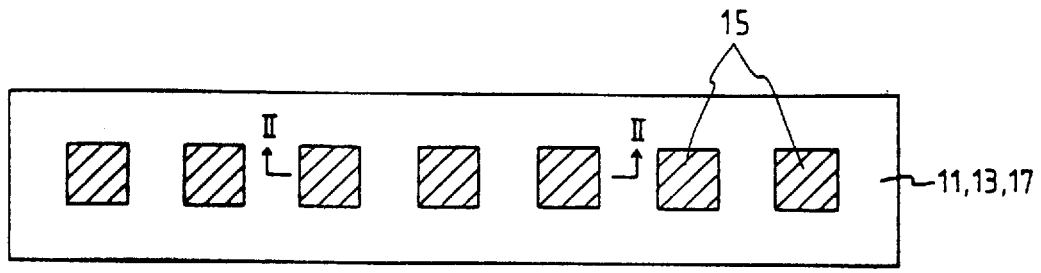
FIG. 1 is a schematic plane view showing a plurality of positively polar alignment marks in a semiconductor device.
Figure 2:
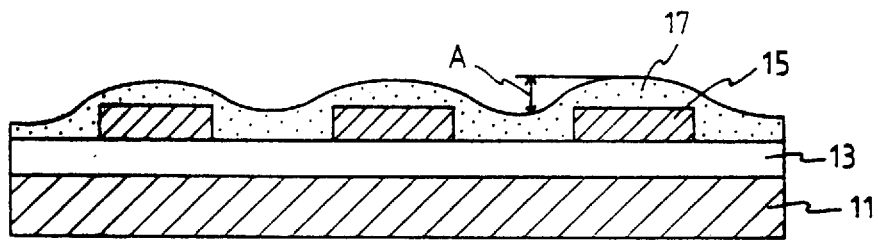
FIG. 2 is a schematic cross sectional view illustrating a process for forming positively polar alignment marks, taken generally through line II—II of FIG. 1.
Figure 3:
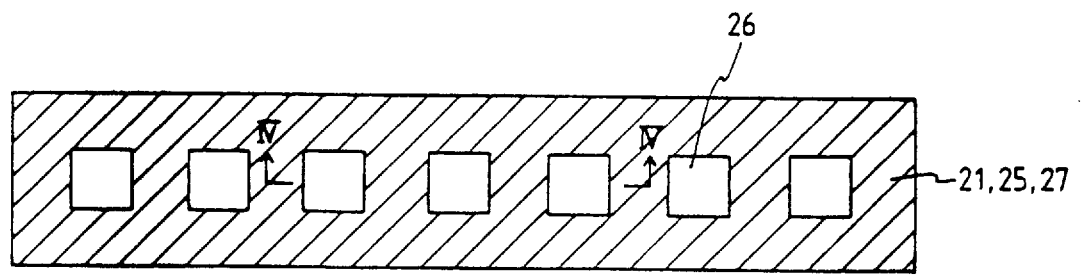
FIG. 3 is a schematic plane view showing a plurality of negatively polar alignment marks in a semiconductor device.
Figure 4:
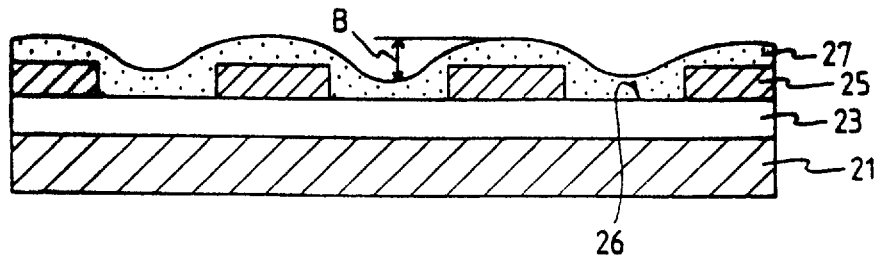
FIG. 4 is a schematic cross sectional view illustrating a process fox forming negatively polar alignment marks, taken generally through line IV—IV of FIG. 3.
Figure 5:
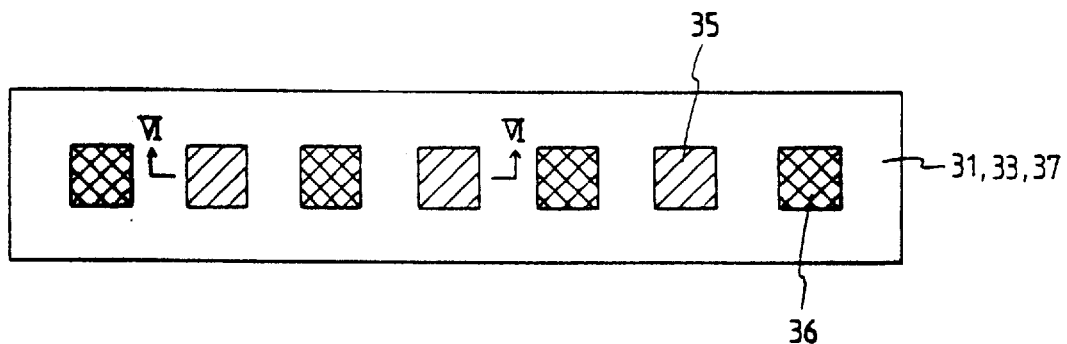
FIG. 5 is a schematic plane view showing a plurality of bipolar alignment marks in a semiconductor device of the present invention.
Figure 6:
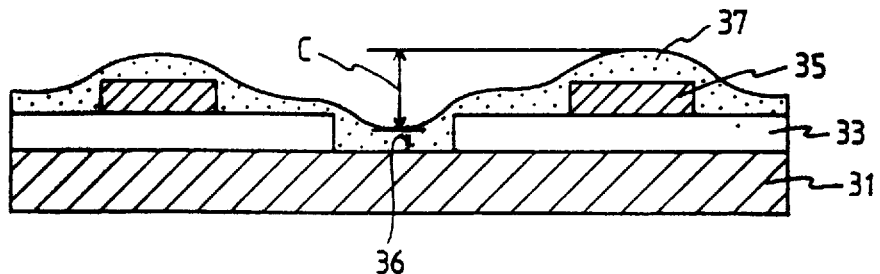
FIG. 6 is a schematic cross sectional view illustrating a process for forming bipolar alignment marks, taken generally through line VI—VI of FIG. 5, according to the present invention.

The application of the preferred embodiments of the present invention is best understood by referring to FIGS. 5 and 6.

FIGS. 5 and 6 show a plurality of bipolar alignment marks in a semiconductor device and illustrate a formation process therefor, in a plane view and a cross sectional view taken generally through line VI—VI of the plane view, respectively.

In these drawings, there is a semiconductor substrate 31 on which a first remaining layer pattern 33 is formed with a plurality of positively polar alignment marks 35 and a plurality of negatively polar alignment marks 36 being alternatively aligned parallel to as well as regularly distant from one another. Both the positively polar alignment marks and the negatively polar alignment marks are a scribe region of semiconductor substrate where no integrated circuit, e.g. semiconductor chip is formed and which thus play a role in defining chip-forming regions in a wafer.

Each of the negatively polar alignment marks 36 is a trench of regular tetragon which has a side length of, for example, 4 $\mu$m and is sunken from the surface of the first remaining layer pattern 33 to the surface of the semiconductor substrate 31. Say, the negatively polar alignment mark 36 is composed of a floor of the semiconductor substrate 31 and four walls of the first remaining layer pattern 33 wherein the floor is a regular tetragon with an area of, for example, 4 $\mu$m×4 $\mu$m and the wall has a height corresponding to the thickness of the first remaining layer pattern 33.

With regard to the positively polar alignment marks 35, each is a column of regular tetrahedron protruded from the surface of the first remaining layer pattern 33 with the area of the regular tetrahedron being, for example, 4 $\mu$m×4 $\mu$m. They are formed by coating a second remaining layer for the integrated circuit and subjecting the second remaining layer to pattern. In accordance with the present invention, the positively polar alignment marks 35 are formed of a different material in etch selection ratio from the first remaining layer pattern 33.

On exposed areas of the resulting structure, for example, on uncovered areas of the first remaining layer pattern by the positively polar alignment marks 35, on areas of the negatively polar alignment 36 and on areas of the positively polar alignment marks 35, there is uniformly coated a third remaining layer 37. At the surface of the third remaining layer 37, there are steps that correspond to the height from the bottom of the negatively polar alignment mark 36 to the upper surface of the positively polar alignment mark 35. As apparent from the accompanying drawings, the bipolar alignment mark structure having the positively and negatively polar marks of the present invention have steps at least twice as high as the conventional monopolar alignment marks.

Now, a description will be made in conjunction with a process for forming the bipolar alignment marks with the positively and negatively polar structure with reference to FIG. 6.

On the semiconductor substrate 31 is first formed a first remaining layer which is, in turn, subjected to etch in such a way to remove predetermined areas of the first remaining layer, for example, a regular tetragonal area with a side length of 4 μm. As a result, a plurality of the negatively polar alignment marks 36 is formed that are aligned parallel to and regularly distant from one another.

Subsequently, a second remaining layer is coated entirely over the resulting structure and then is so etched as to leave the second remaining layer only on predetermined portions of the etched first remaining layer, which portions are regularly distant from the negatively polar marks 36, in a predetermined form, for example, a column of regular tetragon with a side length of 4 μm. As a result, a plurality of positively polar alignment marks 34 is formed.

Finally, a fourth remaining layer 37 is uniformly coated on all areas of the resulting structure.

In the bipolar alignment mark structure where the positively and the negatively polar alignment marks 35, 36 are alternatively formed, there are generated steps C that have a height corresponding to the altitude from the bottom of the negatively polar alignment mark 36 to the upper surface of the positively polar alignment marks 35. The surface step in the bipolar alignment mark structure according to the present invention is at least twice as large as that in the conventional monopolar alignment mark structure and thus can indicate standard coordinates of semiconductor substrate more definitively and distinctively.

Following description is a case that the formation process fox bipolar alignment marks is applied for a DRAM or SRAM device.

On a scribe line of a semiconductor substrate 31, the first remaining layer is formed of polysilicon by a polysilicon-coating process for capacitor formation. And, when a metal contact is formed, the first remaining layer is etched, to form the negatively polar alignment marks 36.

Thereafter, over all areas of the resulting structure is coated a second remaining layer consisting of a material different from the first remaining layer, for example, an interlayer oxide film or borophospho silicate glass (BPSG). Following completion of the coating, when a second metal contact is formed, the second remaining layer is etched to form a plurality of positively polar alignment marks 35 with a form of regular tetragonal column, each of which alternates with each of the negatively polar alignment marks 36. Then, a metallic third remaining layer 37 is coated over the entire area of the resulting structure.

The process first calls for forming a first remaining layer on a scribe region of the semiconductor substrate, patterning the first remaining layer to form a plurality of negatively polar alignment marks in such a way that they are aligned regularly distant from one another, and then forming a second remaining layer entirely over the resulting exposed surfaces with a material different from the first remaining layer in etch selection ratio. Finally, the second layer is etched to form a plurality of positively polar alignment marks in such a way that they alternate with the negatively polar alignment marks, thereby increasing the topology between the positively polar alignment marks and the negatively polar alignment marks.

The first and the second remaining layers are exemplified by polysilicon and interlayer insulating film, respectively, but may be formed of any materials if they are largely different from each other in etch selection ratio. If the first remaining layer is etched when an etch process is applied to the second remaining layer fox the positively polar alignment marks 35, the step portion contributed by the negatively polar alignment mark 36 is reduced. Accordingly, when the third remaining layer 37 is coated, it comes to be thickly formed at the shallow portion, which leads to reduction of the total step C.

Although the alignment mark formed in the above described embodiment alternates between positively polar alignment mark with a form of trench of regular tetragon and negatively polar alignment mark with a form of column of regular tetragon, they may have different forms and any numbers thereof may be alternatively aligned, if necessary.

As described hereinbefore, the present invention pertains to a process for forming alignment marks useful to align patterns in a semiconductor device, wherein a first remaining layer is formed on a scribe line of a semiconductor device, which layer has a plurality of negatively polar alignment marks with a form of trench of regular tetragon aligned regularly distant from one another, a second remaining layer is formed of a material having a different etch selection ratio from the second remaining layer, the second remaining layer is subjected to etch, to form a plurality of positively polar alignment marks which alternates with the negatively polar alignment marks, and a metal layer with high reflection rate is formed on the resulting structure. With the process according to the present invention, the step at the metal layer is more enlarged by the bipolar structure, which allows easy and accurate measurement of alignment mark. Based on this ease, the present process gives convenience to the fabrication process for a semiconductor device, along with high yield. In addition, the accuracy in measuring an alignment mark can bring about an effect that the semiconductor device is improved in reliability.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A process for forming a bipolar alignment mark structure in a semiconductor device, comprising the steps of:

forming a first remaining layer on a scribe region of a semiconductor substrate;

patterning the first remaining layer to form a plurality of negatively polar alignment marks in such a way that they are aligned regularly distant from one another;

forming a second remaining layer over the negatively polar alignment marks and non-removed portions of the first remaining layer with a material which is different from the first remaining layer in etch selection ratio; and patterning a portion of the second remaining layer formed on the non-removed portions of the first remaining layer between the negatively polar alignment marks to form a plurality of positively polar alignment marks in such a way that they alternate with the negatively polar alignment marks thereby increasing the topology between said positively polar alignment marks and said negatively polar alignment marks.

2. A process for forming a bipolar alignment mark structure in a semiconductor device according to claim 1, wherein said process further comprises the step of forming a third remaining layer over all areas of the negatively polar alignment marks and all areas of the positively polar alignment marks so as to form steps at the surface of said third remaining layer that correspond to the height from the bottom of the negatively polar alignment marks to the upper surface of the positively polar alignment marks.

3. A process for forming a bipolar alignment mark structure in a semiconductor device, wherein said negatively polar alignment marks have a form of trench of regular tetragon and said positively polar alignment marks have a form of column of regular tetragon.

4. A process for forming a bipolar alignment mark structure in a semiconductor device, comprising the steps of:

forming a first remaining layer on a scribe region of a semiconductor substrate;

etching said first remaining layer to remove a plurality of portions of said first remaining layer so as to form a plurality of negatively polar alignment marks between the non-removed portions of said first remaining layer in such a way that said negatively polar alignment marks are aligned regularly distant from one another;

forming a second remaining layer directly and entirely on the non-removed portions of said first remaining layer, said second remaining layer being of a material that is different from the first remaining layer in etch selection ratio; and etching the second remaining layer to form a plurality of positively polar alignment marks in such a way that the positively polar alignment marks alternate with the negatively polar alignment marks thereby increasing the topology between said positively polar alignment marks and said negatively polar alignment marks; and forming a third remaining layer over all areas of the negatively polar alignment marks and all areas of the positively polar alignment marks so as to form steps at the surface of said third remaining layer that correspond to the height from the bottom of the negatively polar alignment marks to the upper surface of the positively polar alignment marks.

* * * * *

UNITED STATES PATENT AND TRADEMARK OFFICE
CERTIFICATE OF CORRECTION

PATENT NO. : 5,882,980

DATED : 03/16/99

INVENTOR(S) : BAE

It is certified that error appears in the above-identified patent and that said Letters Patent is hereby corrected as shown below:

Claim 3, line 2 after the word "device" and before the "," insert the phrase -- according to Claim 1 --.

Signed and Sealed this

Nineteenth Day of October, 1999

Attest:

Q. TODD DICKINSON

*Attesting Officer*   *Acting Commissioner of Patents and Trademarks*